US00RE42128E

(19) United States
(12) Reissued Patent
Egbe

(10) Patent Number: US RE42,128 E
(45) Date of Reissued Patent: Feb. 8, 2011

(54) COMPOSITIONS FOR REMOVING RESIDUE FROM A SUBSTRATE AND USE THEREOF

(75) Inventor: Matthew Egbe, West Norriton, PA (US)

(73) Assignee: Air Products and Chemicals, Inc., Allentown, PA (US)

(21) Appl. No.: 12/321,730

(22) Filed: Jan. 22, 2009

Related U.S. Patent Documents

Reissue of:
(64) Patent No.: 7,166,419
Issued: Jan. 23, 2007
Appl. No.: 10/254,785
Filed: Sep. 26, 2002

(51) Int. Cl.

| | |
|---|---|
| ***G03F 7/42*** | (2006.01) |
| ***C11D 7/26*** | (2006.01) |
| ***C11D 7/32*** | (2006.01) |
| ***C11D 7/50*** | (2006.01) |
| ***C23G 1/02*** | (2006.01) |

(52) U.S. Cl. ..... 430/392; 430/331; 134/1.3; 134/2; 134/3; 510/175; 510/176; 510/254; 510/257

(58) Field of Classification Search ..... 430/329, 430/331; 134/1.3, 2, 3; 510/175, 176, 254, 510/257
See application file for complete search history.

(56) References Cited

U.S. PATENT DOCUMENTS

| | | | | | |
|---|---|---|---|---|---|
| 4,617,251 | A | | 10/1986 | Sizensky | |
| 5,106,525 | A | * | 4/1992 | Sullivan | 510/206 |
| 5,139,607 | A | | 8/1992 | Ward et al. | |
| 5,279,771 | A | * | 1/1994 | Lee | 510/212 |
| 5,417,877 | A | | 5/1995 | Ward | |
| 5,472,830 | A | * | 12/1995 | Honda | 510/176 |
| 5,507,978 | A | * | 4/1996 | Honda | 510/176 |
| 5,529,887 | A | | 6/1996 | Horn et al. | |
| 5,554,312 | A | * | 9/1996 | Ward | 510/175 |
| 5,753,601 | A | | 5/1998 | Ward et al. | |
| 5,792,274 | A | | 8/1998 | Tanabe et al. | |
| 5,905,063 | A | | 5/1999 | Tanabe et al. | |
| 5,972,862 | A | | 10/1999 | Torii et al. | |
| 6,261,745 | B1 | | 7/2001 | Tanabe et al. | |
| 6,372,410 | B1 | | 4/2002 | Ikemoto et al. | |
| 6,554,912 | B2 | | 4/2003 | Sahbari | |
| 6,677,286 | B1 | | 1/2004 | Rovito et al. | |
| 6,869,921 | B2 | | 3/2005 | Koito et al. | |
| 2001/0001785 | A1 | | 5/2001 | Honda et al. | |
| 2002/0146647 | A1 | | 10/2002 | Aoki et al. | |
| 2003/0022800 | A1 | | 1/2003 | Peters et al. | |
| 2003/0114014 | A1 | | 6/2003 | Yokoi et al. | |
| 2003/0130147 | A1 | | 7/2003 | Koito et al. | |
| 2003/0181342 | A1 | | 9/2003 | Seijo et al. | |

FOREIGN PATENT DOCUMENTS

| | | |
|---|---|---|
| JP | 1995271058 | 10/1995 |
| JP | 2001005200 | 1/2001 |
| JP | 2001100436 | 4/2001 |
| JP | 2001232647 | 8/2001 |
| JP | 2001523356 | 11/2001 |
| JP | 2002278092 | 9/2002 |
| JP | 20012366627 | 1/2009 |
| WO | 02/04233 | 1/2002 |

OTHER PUBLICATIONS

English language abstract of JP 58–180566.*
Translation of Japanese application 2001–2366627; Aug. 3, 2001.*

* cited by examiner

*Primary Examiner*—Amanda C. Walke
(74) *Attorney, Agent, or Firm*—Rosaleen P. Morris-Oskanian

(57) ABSTRACT

Compositions containing certain organic solvents and a fluorine source are capable of removing photoresist and etching residue.

53 Claims, No Drawings

COMPOSITIONS FOR REMOVING RESIDUE FROM A SUBSTRATE AND USE THEREOF

Matter enclosed in heavy brackets [ ] appears in the original patent but forms no part of this reissue specification; matter printed in italics indicates the additions made by reissue.

TECHNICAL FIELD

The present invention is concerned with selectively removing etching residues from a microstructure of an object. The present invention selectively removes residues without attacking metal and or silicon dioxide films exposed to the composition used for removing the residues. In addition, the present invention is concerned with certain cleaning compositions that are suitable for removing etching residues.

BACKGROUND ART

Numerous steps are involved in the fabrication of microelectronic structures. Within the manufacturing scheme of fabricating integrated circuits selective etching of semiconductor surfaces is sometimes required. Historically, a number of vastly different types of etching processes, to selectively remove material, have been successfully utilized to varying degrees. Moreover, the selective etching of different layers, within the microelectronic structure, is considered a critical and crucial step in the integrated circuit fabrication process.

Increasingly, reactive ion etching (RIE), is the process of choice for pattern transfer during via, metal line and trench formation. For instance, complex semi-conductor devices such as advanced DRAMS and microprocessors, which require multiple layers of back end of line interconnect wiring, utilize RIE to produce vias, metal lines and trench structures. Vias are used, through the interlayer dielectric, to provide contact between one level of silicon, suicide or metal wiring and the next level of wiring. Metal lines are conductive structures used as device interconnects. Trench structures are used in the formation of metal line structures. Vias, metal lines and trench structures typically expose metals and alloys such as Al, AlCu, Cu, Ti, TiN, Ta, TaN, W, TiW, silicon or a suicide such as a suicide of tungsten, titanium or cobalt. The RIE process typically leaves a residue (of a complex mixture) that may include re-sputtered oxide material as well as possibly organic materials from photoresist and antireflective coating materials used to lithographically define the vias, metal lines and or trench structures.

It would therefore be desirable to provide a selective cleaning material and process capable of removing remaining photoresist as well as the residues caused by selective etching using plasmas in general and RIE specifically. Moreover, it would be desirable to provide a selective cleaning material and process, capable of removing the photoresist and etching residue, that exhibits high selectivity for the residue as compared to metal, silicon, silicide and/or interlevel dielectric materials such as deposited oxides that might also be exposed to the cleaning composition. It would be especially desirable to provide a composition that is compatible with and can be used with such sensitive low-k films as HSQ, MSQ, FOx, black diamond (can you identify these chemically) and TEOS (tetraethylsilicate).

Along these lines, fluoride-containing stripers are usually too aggressive toward sensitive films with low dielectric constant such as HSQ and porous MSQ films.

For example, eventhough formamide is a good protic solvent, it was found that formulations with formamide had decreased compatibility with FOx® films. See Parker, Advances in Organic Chemistry, 5, 1 (1965)

SUMMARY OF INVENTION

The present invention provides compositions capable of selectively removing photoresist and etching residue from a substrate without attacking metal that might also be exposed to the composition. In addition, the present invention provides compositions that exhibit minimal silicon oxide and in general dielectric lower etch rates.

It has been found according to the present invention that by employing certain selected organic solvents in the formulation of strippers, fluoride containing strippers can be formulated to be compatible with low dielectric constant materials. In this invention, efforts have been made to formulate fluoride-containing strippers that will be less aggressive towards sensitive films with low dielectric constant by selecting certain polar protic solvents. In these formulations, the polar protic solvents have been selected to be the major solvents. As a result of choosing solvents that lead to less fluoride ion aggressiveness in this invention, formulations in the invention are very compatible with FOx®, porous JSR, and the like.

Compositions of the present invention exhibit good compatibility with sensitive low-k films, such as FOx® and porous low-k dielectrics, while at the same time maintaining good cleaning ability.

More particularly, the present invention relates to a composition suitable for removing photoresist and etching residue that comprises:

a) at least about 50% by weight of a solvent selected from the group consisting of tetrafurfuryl alcohol, diacetone alcohol, 1,4-cyclohexanedi-methanol, and alkylene glycol ethers;

b) about 0.005 to about 0.8 by weight of a source of fluorine.

c) up to about 49.9% by weight of water; and d) up to about 20% by weight of a corrosion inhibitor.

The present invention also relates to a method for removing photoresist and/or etching residue from a substrate that comprises contacting the substrate with the above-disclosed composition.

Other objections and advantages of the present invention will become readily apparent to those skilled in this art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

The present invention is concerned with selectively removing photoresist and/or etching residues and especially residues cased by reactive ion etching. Moreover, the photoresist and/or etching residues are present in an article that also includes metal, silicon, silicate and/or interlevel dielectric material such as deposited silicon oxides and derivitized silicon oxides such as HSQ, MSQ, FOX, TEOS and Spin-On Glass, wherein both the photoresist and/or residues and the metal, silicon, silicide and/or interlevel dielectric materials will come in contact with the cleaning composition. The present invention provides for selectively removing the photoresist and/or post etch residues without significantly attacking the metal, silicon, silicon dioxide and interlevel dielectric materials. The metal is typically copper, copper alloy, titanium, titanium nitride, tantalum, tantalum nitride, tungsten, titanium/tungsten, aluminum and/or aluminum alloys. The present invention is especially advantageous for structures containing sensitive low k-films. The residues removed according to the present invention are preferably those created by reactive ion etching.

The compositions of the present invention comprise at least about 50% by weight, preferably about 50 to about 80%, and most preferably about 50 to about 70% by weight of at least one organic solvent selected from the group consisting of tetrafurfuryl alcohol, diacetone alcohol, 1,4-cyclohexanedimethanol, and alkylene glycol ethers. The preferred solvents are tetrafurfuryl alcohol and diacetone alcohol. Suitable alkylene glycol ethers include di(ethylene glycol) butyl ether, and propylene glycol methyl ether.

Compositions of the present invention also include a fluoride ion source typically in an amount of about 0.005 to about 0.8% by weight, preferably about 0.05 to about 0.5% by weight.

Typical compounds providing a fluoride ion source according to the present invention are hydrofluoric acid, ammonium fluoride, quaternary ammonium fluorides such as tetramethylammonium fluoride and tetrabutylammonium fluoride, fluoroborates, fluoroboric acid, tetrabutylammonium tetrafluoroborate, and aluminum hexafluoride. Also, a fluoride salt of an aliphatic primary, secondary or tertiary amine can be used. Such have the following formula:

$$R_1N(R_3)R_2F$$

wherein $R_1$, $R_2$ and $R_3$ each individually represent H or an alkyl group,

Typically, the total number of carbon atoms in the $R_1$, $R_2$ and $R_3$ groups is 12 carbon atoms or less. The preferred fluoride compounds are ammonium fluoride and tetramethylammonium fluoride.

The composition of the present invention can also contain up to about 49.9% by weight of water, and preferably about 25–35% by weight of water. Preferably the water is deionized water.

Moreover, the compositions of the present invention can also optionally contain up to about 20% by weight, more typically about 0.2 to about 19% by weight of a corrosion inhibiter, especially when the compositions are to come in contact with metals such as copper. Examples of corrosion inhibitors include, but are not limited to catechol, gallic acid, benzotriazole, resorcinol, other phenols, acids or triazoles, and preferably hydroxylamines or acid salts thereof.

Preferred hydroxylamines are diethylhydroxylamine and the lactic acid salts thereof. Ordinarily, hydroxylamines are not considered as being compatible with copper because of their ability to etch. However, in the composition of the present invention they surprisingly inhibit copper corrosion.

The compositions of the present invention typically have a pH of about 2 to about 6.5, and preferably about 4.5 to about 6.5

The compositions of the present invention are compatible with low-k films such as HSQ (FOx), MSQ, SiLK, etc. The formulations are also effective in stripping photoresists and plasma etch residues such as organic residues, organometallic residues, inorganic residues, metallic oxides, or photoresist complexes at low temperatures with very low corrosion of aluminum, copper, titanium or containing substrates.

During the manufacturing process, a photoresist layer is coated on the substrate. Using photolithographic process, a pattern is defined on the photoresist layer. The patterned photoresist layer is thus subjected to plasma etch by which the pattern is transferred to the substrate. Etch residues are generated in the etch stage. Some of the substrates used in this invention are ashed while some are not ashed. When the substrates are ashed the main residues to be cleaned are etchant residues. If the substrates are not ashed, then the main residues to be cleaned or stripped are both etch residues and photoresists.

The following non-limiting examples are presented to further illustrate the present invention.

Examples A–Z shown below are illustrative examples of suitable compositions of the present invention.

| Example A | | Example B | | * Example C | |
|---|---|---|---|---|---|
| DAA | 59.25 | DAA | 39.25 | BEE | 59.25 |
| Dl Water | 40.45 | Dl Water | 35.45 | Dl Water | 40.45 |
| Amm. Fluoride | 0.3 | Amm. Fluoride | 0.3 | Amm. Fluoride | 0.3 |
| | | BEE | 25 | | |

| Example D | | Example E | | Example F | |
|---|---|---|---|---|---|
| DAA | 64.25 | DAA | 54.25 | DAA | 54.25 |
| Dl Water | 35.45 | Dl Water | 35.45 | Dl Water | 35.45 |
| Amm. Fluoride | 0.3 | Amm. Fluoride | 0.3 | Amm. Fluoride | 0.3 |
| | | EL | 10 | DMAc | 10 |

| Example G | | Example H | | Example I | |
|---|---|---|---|---|---|
| BEE | 54.25 | BEE | 49.25 | BEE | 39.25 |
| Dl Water | 45.45 | Dl Water | 45.45 | Dl Water | 55.45 |
| Amm. Fluoride | 0.3 | Amm. Fluoride | 0.3 | Amm. Fluoride | 0.3 |
| | | Resorcinol | 5 | Resorcinol | 5 |

| Example J | | Example K | | Example L | |
|---|---|---|---|---|---|
| DAA | 44.25 | glycerol | 54.25 | glycerol | 74.25 |
| Dl Water | 35.45 | Dl Water | 35.45 | Dl Water | 25.45 |
| Amm. Fluoride | 0.3 | Amm. Fluoride | 0.3 | Amm. Fluoride | 0.3 |
| EL | 20 | DMAc | 10 | | |

| Example M | | Example N | | Example O | |
|---|---|---|---|---|---|
| THFA | 54.25 | THFA | 44.25 | THFA | 64.35 |
| Dl Water | 45.45 | Dl Water | 35.5 | Dl Water | 35 |
| Amm. Fluoride | 0.3 | Amm. Fluoride | 0.3 | Amm. Fluoride | 0.65 |
| | | DAA | 20 | | |

| Example P | | Example Q | | Example R | |
|---|---|---|---|---|---|
| THFA | 59 | THFA | 54 | THFA | 54 |
| Dl Water | 35.6 | Dl Water | 35.6 | Dl Water | 35.6 |
| Amm. Bifluoride | 0.4 | Amm. Bifluoride | 0.4 | Amm. Bifluoride | 0.4 |
| PG | 5 | PG | 10 | EG | 10 |

| Example S | | Example T | | Example U | |
|---|---|---|---|---|---|
| THFA | 59.35 | THFA | 54.35 | THFA | 60 |
| Dl Water | 35 | Dl Water | 35 | Dl Water | 21.2 |
| Amm. Fluoride | 0.65 | Amm. Fluoride | 0.65 | Amm. Fluoride | 0.8 |
| PVA | 5 | PVA | 10 | Glycerol | 18 |

| Example V | | Example X | | Example Y | |
|---|---|---|---|---|---|
| THFA | 60 | THFA | 55 | THFA | 65 |
| Dl Water | 25.6 | Dl Water | 25.6 | Dl Water | 20.6 |
| Amm. Fluoride | 0.4 | Amm. Fluoride | 0.4 | Amm. Fluoride | 0.4 |
| Glycerol | 14 | Glycerol | 19 | Glycerol | 14 |

-continued

| Example Z | | Example Z1 | | Example Z2 | |
|---|---|---|---|---|---|
| THFA | 65 | CHDM | 54.25 | PGME | 54.25 |
| Dl Water | 19.72 | Dl Water | 45.45 | Dl Water | 45.45 |
| Amm. Fluoride | 0.48 | Amm. Fluoride | 0.3 | Amm. Fluoride | 0.3 |
| Glycerol | 10.8 | | | | |
| Resorcinol | 4 | | | | |

DAA Diacetone alcohol
BEE 2-(2-Butoxyethoxy)ethanol
EL Ethyl lactate
THFA Tetrahydrofurfuryl alcohol
PG Propylene glycol
EG Ethylene glycol
PVA Polyvinyl alcohol
DMAc N,N-dimethylacetamide
CHDM 1,4-cyclohexanedimethanol
PGME Propyleneglycol methyl ether The above compositions are effective in cleaning and stripping of etch residues and photoresists from aluminum and copper lines and vias. The compositions also showed effectiveness in removing etch residues and photoresists from some low and ultra low dielectric constant materials. They are compatible with the low and ultra low dielectric constant materials.

In the following Examples A1–A6, a positive photoresist is spin-coated on to a substrate. The positive photoresist comprises of diazonaphthoquinone and novolak resin. The photoresist coated is baked at 90° C. for 90 seconds. A pattern is defined on the photoresist by exposure, through a patterned mask, to i-line (365 nm) rays followed by development. The pattern is then transferred via plasma etch to the low-k substrate. The compositions shown in Examples A1–A6 are used to remove remaining photoresist and etching.

| Example A1 | | Example A2 | | Example A3 | |
|---|---|---|---|---|---|
| PGME | 63 | PGME | 68 | THFA | 65 |
| Dl Water | 22.6 | Dl Water | 22.6 | Dl Water | 15.72 |
| Amm. Fluoride | 0.8 | Amm. Fluoride | 0.8 | Amm. Fluoride | 0.48 |
| PG | 10 | PG | 5 | Glycerol | 15.8 |
| DEHA | 1.8 | DEHA | 1.8 | amm. Citrate | 3 |
| lactic acid | 1.8 | lactic acid | 1.8 | | |
| **Example A4** | | **Example A5** | | **Example A6** | |
| PGME | 35.5 | PGME | 30.5 | t-PGME | 30.5 |
| PGPE | 20 | PGPE | 15 | PGPE | 15 |
| Dl Water | 25.9 | Dl Water | 25.9 | Dl Water | 25.9 |
| Amm. Fluoride | 0.6 | Amm. Fluoride | 0.6 | Amm. Fluoride | 0.6 |
| PG | 14 | PG | 14 | PG | 14 |
| DEHA | 2 | DEHA | 14 | DEHA | 14 |
| lactic | 2 | | | | |

A more detailed discussion of selected examples described above is presented below:

EXAMPLE A

The composition of example A consists of 59.25 weight % of diacetone alcohol, 0.3 weight % of ammonium fluoride, and 40.45 weight % of deionized water. Example A is a cleaning and stripping composition for removing etch residue and photoresists for low-k substrates as well as metal substrates.

EXAMPLE C

The composition of example C consists of 59.25 weight % of 2-(2-butoxyexthoxy)ethanol, 0.3 weight % of ammonium fluoride, and 40.45 weight % of deionized water. Example C is a cleaning and stripping composition for removing etch residues and photoresists from low-k and metal lines as well as vias.

EXAMPLE H

The composition of example H consists of 49.25 weight % of 2-(2-butoxyethoxy)ethanol, 0.3 weight % of ammonium fluoride, 45.45 weight % of deionized water and 5 weight % of resorcinol. The composition is designed for etch residue and photoresist removal on aluminum copper substrates.

EXAMPLE V

The composition of example V consists of 60 weight % of tetrahydrofurfuryl alcohol, 0.4 weight % of ammonium fluoride, 25.6 weight % of deionized water and 14 weight % of glycerol. This composition is also effective is cleaning and stripping of etch residues and photoresists from low-k and metal lines and vias.

EXAMPLE A1

The composition of example A1 consists of 63 weight % of propylene glycol methyl ether, 22.6 weight % deionized water, 0.8 weight % of ammonium fluoride, 10 weight % of propylene glycol, 1.8 weight % of diethylhydroxylamine and 1.8 weight % lactic acid. Example H is a cleaning and stripping composition for removing etch residues and photoresists from low-k and metal lines as well as vias.

EXAMPLE A3

The composition of example A3 consists of 65 weight % of tetrahydrofurfuryl alcohol, 15.72 weight % deionized water, 0.48 weight % of ammonium fluoride, 15.8 weight % of glycerol and 3 weight % of ammonium citrate. Example A3 a cleaning and stripping composition for removing etch residues and photoresists from low-k and metal lines as well as vias.

EXAMPLE A4

The composition of example A4 consists of 35.5 weight % of propylene glycol methyl ether, 20 weight % propylene glycol propyl ether, 25.9 weight % deionized water, 0.6 weight % of ammonium fluoride, 14 weight % of propylene glycol, 2 weight % of diethylhydroxylamine and 2 weight % lactic acid. Example A4 is a cleaning and stripping composition for removing etch residues and photoresists from low-k and metal lines as well as vias.

EXAMPLE A5

The composition of example A5 consists of 30.5 weight % of propylene glycol methyl ether, 15 weight % of propylene glycol propyl ether, 25.9 weight % deionized water, 0.6 weight % of ammonium fluoride, 14 weight % of propylene glycol and 14 weight % of diethylhydroxylamine. Example A5 is a cleaning and stripping composition for removing etch residues and photoresists from low-k and metal lines as well as vias.

EXAMPLE A6

The composition of example A6 consists of 30.5 weight % of tri(propylene glycol) methyl ether, 15 weight % of propylene glycol propyl ether, 25.9 weight % deionized water, 0.6 weight % of ammonium fluoride, 14 weight % of propylene glycol and 14 weight % of diethylhydroxylamine. Example A6 is a cleaning and stripping composition for removing etch residues and photoresists from low-k and metal lines as well as vias.

All of the examples from the Table are very effective in stripping and cleaning photoresists, etch and ashed residues. The process temperature should not be greater than 40° C. and each of the examples can be used in bath cleaning process, spray tools and single wafer tools.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the invention concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A composition suitable for removing photoresist and etching residue which comprises:

a) at least about 50% by weight of a solvent which is tetrahydrofurfuryl alcohol;

b) about 0.005 to about 0.8 by weight of a source of fluorine.

c) up to about 49.9% by weight of water; and d) up to about 20% by weight of a corrosion inhibitor.

2. The composition of claim 1 wherein the fluorine source is selected from the group consisting of hydrofluoric acid, ammonium fluoride, quaternary ammonium fluorides, fluoroborates, fluoroboric acid, tin bifluoride, antimony fluoride, tetrabutylammonium tetrafluoroborate, aluminum hexafluoride, and a fluoride salt of an aliphatic primary, secondary or tertiary amine having the following formula:

$$R_1N(R_3)R_2$$

wherein $R_1$, $R_2$ and $R_3$ each individually represent H or an alkyl group.

3. The composition of claim 1 wherein the fluorine source comprises ammonium fluoride or teframethylammonium fluoride.

4. The composition of claim 1 wherein said corrosion inhibitor comprises a hydroxylamine.

5. The composition of claim 4 wherein said hydroxy amine comprises diethyl hydroxylamine.

6. The composition of claim 1 wherein the amount of said solvent is about 50% by weight to about 75 by weight;

said source of fluorine is about 0.05 to about 0.5% by weight, and said water is about 25 to about 35% by weight.

7. The composition of claim 6 wherein the amount of said corrosion inhibitor is about 0.5 to about 20% by weight.

8. The composition of claim 6 wherein the amount of said corrosion inhibitor is about 10 to about 14% by weight.

9. The composition of claim 1 being free of organic carboxylic acids.

10. A method for removing photoresist or etching residue or both from a substrate wherein comprises contacting said substract with a composition comprising:

a) at least about 50% by weight of a solvent which is tetrahydrofurfuryl alcohol;

b) about 0.005 to about 0.8 by weight of a source of fluorine c) up to about 49.9% by weight of water; and d) up to about 20% by weight of a corrosion inhibitor.

11. The method of claim 10 wherein the fluorine source is selected from the group consisting of hydrofluoride, quaternary ammonium fluorides, fluoroborates, fluoroboric acid, tin bifluoride, antimony fluoride, tetrabutylammonium tetrafluoroborate, aluminum hexafluoride, and a fluoride salt of an aliphatic primary, secondary or tertiary amine having the following formula:

$$R_1N(R_3)R_2F$$

wherein $R_1$, $R_2$ and $R_3$ each individually represent H or an alkyl group.

12. The method of claim 10 wherein the fluorine source comprises ammonium fluoride or tetramethylammonium fluoride.

13. The method of claim 10 wherein said corrosion inhibitor comprises a hydroxylamine.

14. The method of claim 13 wherein said hydroxy amine comprises diethyl-hydroxylamine.

15. The method of claim 10 wherein the amount of said solvent is about 50% by weight to about 75% by weight; source of fluorine is about 0.05 to about 0.5% by weight, and said water is about 25 to about 35% by weight.

16. The method of claim 15 wherein the amount of said corrosion inhibitor is about 0.5 to about 20% by weight.

17. The method of claim 15 wherein the amount of said corrosion inhibitor is about 10 to about 14% by weight.

18. The method of claim 10 wherein said composition is free of organic carboxylic acids.

19. The method of claim 10 wherein the substrate also includes a material selected from the group consisting of metal, silicon, silicate and interlevel dielectric material.

20. The method of claim 19 wherein the interlevel dielectric material comprises silicon oxides.

21. The method of claim 19 wherein The metal is selected from the group consisting of copper, copper alloy, titanium, titanium nitride, tantalum, tantalum nitride, tantalum, tantalum nitride, aluminum and/or aluminum alloy.

*22. A composition for removing residues comprising at least one residue selected from photoresist residues, etch residues, and mixtures thereof, the composition comprising:*

*at least about 50% by weight of an organic solvent comprising:*

*an alkylene glycol ether; and*

*at least one solvent selected from propylene glycol, ethylene glycol, glycerol, polyvinyl alcohol, ethyl lactate, and N-N-dimethylacetamide;*

*a source of fluorine;*

*up to about 49.9% by weight of water; and*

*optionally up to about 20% by weight of a corrosion inhibitor.*

*23. The composition of claim 22 wherein the source of fluorine comprises at least one selected from the group consisting of hydrofluoric acid, ammonium fluoride, quaternary ammonium fluorides, fluoroborates, fluoroboric acid, tin bifluoride, antimony fluoride, tetrabutylammonium*

*tetrafluoroborate, aluminum hexafluoride, and a fluoride salt of an aliphatic primary, secondary or tertiary amine having the following formula:*

$$R_1N(R_3)R_2$$

*wherein $R_1$, $R_2$ and Ra each individually represent H or an alkyl group.*

*24. The composition of claim 23 wherein the source of fluorine comprises ammonium fluoride.*

*25. The composition of claim 23 wherein the source of fluorine comprises the fluoride salt of an aliphatic primary, secondary or tertiary amine having the following formula:*

$$R_1N(R_3)R_2$$

*wherein $R_1$, $R_2$ and $R_3$ each individually represent H or an alkyl group.*

*26. The composition of claim 22 wherein the at least one solvent comprises propylene glycol.*

*27. The composition of claim 22 wherein the at least one solvent comprises ethylene glycol.*

*28. The composition of claim 22 wherein the at least one solvent comprises glycerol.*

*29. The composition of claim 22 wherein the at least one solvent comprises polyvinyl alcohol.*

*30. The composition of claim 22 wherein the at least one solvent comprises N-N-dimethylacetamide.*

*31. The composition of claim 22 wherein the composition comprises a corrosion inhibitor.*

*32. The composition of claim 31 wherein the corrosion inhibitor comprises a hydroxylamine.*

*33. The composition of claim 32 wherein the corrosion inhibitor further comprises an acid.*

*34. The composition of claim 33 wherein the corrosion inhibitor comprises lactic acid.*

*35. A composition for removing residues comprising at least one residue selected from photoresist residues, etch residues, and mixtures thereof, the composition comprising:*

*at least about 50% by weight of an organic solvent comprising:*

*an alkylene glycol ether; and*

*at least one solvent selected from propylene glycol and glycerol;*

*about 0.005 to about 0.8% by weight of a source of fluorine;*

*up to about 49.9% by weight of water; and*

*up to about 20% by weight of a corrosion inhibitor.*

*36. The composition of claim 35 wherein the corrosion inhibitor comprises a hydroxylamine.*

*37. The composition of claim 36 wherein the corrosion inhibitor further comprises an acid.*

*38. The composition of claim 36 wherein the corrosion inhibitor comprises lactic acid.*

*39. The composition of claim 35 wherein the at least one solvent comprises propylene glycol.*

*40. The composition of claim 35 wherein the at least one solvent comprises glycerol.*

*41. A method for removing residues comprising at least one residue selected from photoresist residues, etch residues, and mixtures thereof from a substrate, the method comprising:*

*contacting the substrate with a composition comprising:*

*at least about 50% by weight of an organic solvent comprising:*

*an alkylene glycol ether; and*

*at least one solvent selected from propylene glycol, ethyl glycol, glycerol, polyvinyl alcohol, ethyl lactate, and N-N-dimethylacetamide;*

*a source of fluorine;*

*up to about 49.9% by weight of water; and*

*optionally up to about 20% by weight of a corrosion inhibitor.*

*42. The method of claim 41 wherein the wherein the source of fluorine comprises at least one selected from the group consisting of hydrofluoric acid, ammonium fluoride, quaternary ammonium fluorides, fluoroborates, fluoroboric acid, tin bifluoride, antimony fluoride, tetrabutylammonium tetrafluoroborate, aluminum hexafluoride, and a fluoride salt of an aliphatic primary, secondary or tertiary amine having the following formula:*

$$R_1N(R_3)R_2$$

*wherein $R_1$, $R_2$ and $R_3$ each individually represent H or an alkyl group.*

*43. The method of claim 42 wherein the source of fluorine comprises ammonium fluoride.*

*44. The method of claim 41 wherein the source of fluorine comprises the fluoride salt of an aliphatic primary, secondary or tertiary amine having the following formula:*

$$R_1N(R_3)R_2$$

*wherein $R_1$, $R_2$ and $R_3$ each individually represent H or an alkyl group.*

*45. The method of claim 41 wherein the at least one solvent comprises propylene glycol.*

*46. The method of claim 41 wherein the at least one solvent comprises ethylene glycol.*

*47. The method of claim 41 wherein the at least one solvent comprises glycerol.*

*48. The method of claim 41 wherein the at least one solvent comprises polyvinyl alcohol.*

*49. The method of claim 41 wherein the at least one solvent comprises N-N-dimethylacetamide.*

*50. The method of claim 41 wherein the composition comprises a corrosion inhibitor.*

*51. The method of claim 50 wherein the corrosion inhibitor comprises a hydroxylamine.*

*52. The method of claim 51 wherein the corrosion inhibitor further comprises an acid.*

*53. The composition of claim 52 wherein the corrosion inhibitor comprises lactic acid.*

* * * * *

UNITED STATES PATENT AND TRADEMARK OFFICE

CERTIFICATE OF CORRECTION

PATENT NO. : RE42,128 E
APPLICATION NO. : 12/321730
DATED : February 8, 2011
INVENTOR(S) : Matthew Egbe It is certified that error appears in the above-identified patent and that said Letters Patent is hereby corrected as shown below:

Claim 2, line 46 insert an -- F -- after "$R_2$" in the formula.

Claim 23, line 5 insert an -- F -- after the "$R_2$" in the formula.

Claim 23, line 7 delete "Ra" and insert -- $R_3$ --.

Claim 25, line 16 insert an -- F -- after "$R_2$" in the formula.

Claim 42, line 26 insert an -- F -- after "$R_2$" in the formula.

Claim 44, line 37 insert an -- F -- after "$R_2$" in the formula.

Signed and Sealed this
Seventeenth Day of April, 2012

David J. Kappos

David J. Kappos
*Director of the United States Patent and Trademark Office*

UNITED STATES PATENT AND TRADEMARK OFFICE

CERTIFICATE OF CORRECTION

PATENT NO. : RE42,128 E
APPLICATION NO. : 12/321730
DATED : February 8, 2011
INVENTOR(S) : Matthew Egbe It is certified that error appears in the above-identified patent and that said Letters Patent is hereby corrected as shown below:

Claim 2, Column 7, line 46 insert an -- F -- after "$R_2$" in the formula.

Claim 23, Column 9, line 5 insert an -- F -- after the "$R_2$" in the formula.

Claim 23, Column 9, line 7 delete "Ra" and insert -- $R_3$ --.

Claim 25, Column 9, line 16 insert an -- F -- after "$R_2$" in the formula.

Claim 42, Column 10, line 26 insert an -- F -- after "$R_2$" in the formula.

Claim 44, Column 10, line 37 insert an -- F -- after "$R_2$" in the formula.

This certificate supersedes the Certificate of Correction issued April 17, 2012.

Signed and Sealed this
Eighth Day of May, 2012

David J. Kappos

David J. Kappos
*Director of the United States Patent and Trademark Office*